(12) United States Patent
Liu et al.

(10) Patent No.: US 10,347,806 B2
(45) Date of Patent: Jul. 9, 2019

(54) PACKAGED UV-LED DEVICE WITH ANODIC BONDED SILICA LENS AND NO UV-DEGRADABLE ADHESIVE

(71) Applicant: Luminus, Inc., Sunnyvale, CA (US)

(72) Inventors: Kai Liu, Dublin, CA (US); Tao Tong, Fremont, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 15/485,644

(22) Filed: Apr. 12, 2017

(65) Prior Publication Data

US 2018/0301604 A1    Oct. 18, 2018

(51) Int. Cl.

| | |
|---|---|
| *H01L 31/107* | (2006.01) |
| *H01L 33/58* | (2010.01) |
| *H01L 33/48* | (2010.01) |
| *H01L 33/60* | (2010.01) |
| *H01L 33/62* | (2010.01) |
| *H01L 33/00* | (2010.01) |

(Continued)

(52) U.S. Cl.
CPC .............. *H01L 33/58* (2013.01); *G02B 7/022* (2013.01); *G02B 19/0014* (2013.01); *G02B 19/0061* (2013.01); *H01L 33/0095* (2013.01); *H01L 33/486* (2013.01); *H01L 33/60* (2013.01); *H01L 33/62* (2013.01); *G02B 5/0858* (2013.01); *H01L 2933/0058* (2013.01); *H01L 2933/0066* (2013.01)

(58) Field of Classification Search
CPC ......... H01L 33/58; H01L 33/62; H01L 33/60; H01L 33/486; H01L 33/0095; H01L 2933/0066; H01L 2933/0058; G02B 5/0858; G02B 7/02
See application file for complete search history.

(56) References Cited

U.S. PATENT DOCUMENTS

| | | | |
|---|---|---|---|
| 7,354,846 B2 | 4/2008 | Kim et al. | ............ 438/555 |
| 8,648,365 B2 * | 2/2014 | Won | ...... H01L 25/167 257/98 |

(Continued)

OTHER PUBLICATIONS

C3535U-UNx1 High Power UV LED Product Datasheet Rev. 2.0, SemiLEDs Corporation, 15 pages (2005-2014).

(Continued)

*Primary Examiner* — Ismail A Muse
(74) *Attorney, Agent, or Firm* — Wolf, Greenfield & Sacks, P.C.

(57) ABSTRACT

A packaged UV-LED device comprises a die carrier member having a cup-shaped recess, a fused silica lens member that is anodic bonded to the die carrier member, and a UV-LED die that is flip-chip mounted within a sealed cavity formed by the carrier member and the lens member. The carrier member involves a unitary cup member fashioned in an economical way from monocrystalline silicon wafer material. A dielectric/aluminum reflector that is effective for UV radiation and that does not degrade and overheat is disposed on the sidewalls of the recess. The lens member is anodic bonded to a silicon surface of the rim of this unitary cup member at a time when the UV-LED die is disposed in the recess. The anodic bonding is done in such way that the die is not damaged and such that the entire packaged UV-LED device includes no UV-degradable adhesive.

12 Claims, 6 Drawing Sheets

CROSS-SECTIONAL SIDE VIEW OF THE PACKAGED UV-LED DEVICE

(51) Int. Cl.
  *G02B 7/02* (2006.01)
  *G02B 19/00* (2006.01)
  *G02B 5/08* (2006.01)

(56) References Cited

U.S. PATENT DOCUMENTS

| | | | |
|---|---|---|---|
| 8,966,748 B2 | 3/2015 | Leib et al. .................... 29/832 |
| 9,935,251 B1* | 4/2018 | Johnson ................ H01L 33/644 |
| 2003/0095759 A1* | 5/2003 | Dautartas ............. G02B 6/4201 |
| | | | 385/92 |
| 2004/0245532 A1* | 12/2004 | Maeda ............... C09K 11/7734 |
| | | | 257/89 |
| 2007/0161211 A1* | 7/2007 | Sunohara ............. B81B 7/0067 |
| | | | 438/455 |
| 2007/0228386 A1* | 10/2007 | Shie .................... H01L 33/486 |
| | | | 257/79 |
| 2007/0246724 A1* | 10/2007 | Wen ....................... H01L 33/62 |
| | | | 257/98 |
| 2007/0269586 A1* | 11/2007 | Leatherdale ........... H01L 33/58 |
| | | | 427/66 |
| 2011/0169034 A1* | 7/2011 | Tseng .................. H01L 33/486 |
| | | | 257/98 |
| 2012/0248481 A1* | 10/2012 | Seo ..................... H01L 33/486 |
| | | | 257/98 |
| 2012/0298295 A1* | 11/2012 | Youngner ............... G04F 5/14 |
| | | | 156/272.2 |
| 2012/0314393 A1* | 12/2012 | Leib ...................... H01L 24/97 |
| | | | 361/809 |
| 2013/0105978 A1 | 5/2013 | Hung ........................... 257/751 |
| 2013/0214298 A1* | 8/2013 | Lin ......................... H01L 33/60 |
| | | | 257/88 |
| 2014/0084322 A1* | 3/2014 | Park ...................... H01L 33/486 |
| | | | 257/98 |
| 2015/0226385 A1* | 8/2015 | Andrews ............... H01L 33/507 |
| | | | 362/293 |
| 2015/0280077 A1* | 10/2015 | Wakaki ................... H01L 33/44 |
| | | | 257/99 |
| 2015/0325749 A1* | 11/2015 | Katsuno ................ H01L 33/405 |
| | | | 257/98 |
| 2016/0043296 A1* | 2/2016 | Jung .................... H01S 5/02469 |
| | | | 257/99 |
| 2016/0380014 A1* | 12/2016 | Ganapathi .......... H04N 5/23232 |
| | | | 348/164 |
| 2017/0054071 A1* | 2/2017 | Takeda ............... G01R 33/0206 |
| 2017/0104138 A1* | 4/2017 | Shatalov ................. H01L 33/56 |
| 2017/0194533 A1* | 7/2017 | Liu ...................... H01L 33/486 |
| 2018/0006203 A1* | 1/2018 | Liu ......................... H01L 33/62 |

OTHER PUBLICATIONS

Web page advertising "Part# C3535U-UNL 1-A1G11H, Ultra-Violet (UV) High Power LED Star", LEDSupply, 3 pages (downloaded Apr. 5, 2017).

Web page advertising "10003 Carclo Lens 20mm Spot LED Optic" from Carclo Optics, LEDSupply, 2 pages (downloaded Apr. 5, 2017).

Presentation entitled "Hermetic Packaging Solutions using Borosilicate Glass Thin Films", MSG Lithoglas GmbH, 23 pages (downloaded Apr. 5, 2017).

* cited by examiner

TOP-DOWN PHOTOGRAPHIC VIEW OF A
COMMERCIALLY AVAILABLE UV-LED DEVICE

PERSPECTIVE DIAGRAM OF THE PACKAGED UV-LED WITHIN THE DEVICE OF FIG. 1

TOP-DOWN VIEW OF PACKAGED UV-LED DEVICE
MOUNTED ON STAR BOARD MCPCB SUBSTRATE

TOP-DOWN VIEW OF STAR BOARD MCPCB
SUBSTRATE

CROSS-SECTIONAL SIDE VIEW OF STAR BOARD MCPCB SUBSTRATE

TOP-DOWN VIEW OF PACKAGED UV-LED DEVICE

TOP-DOWN VIEW OF THE PACKAGED UV-LED DEVICE WITH ITS LENS REMOVED
(DIELECTRIC NOT SHOWN)

TOP-DOWN VIEW OF THE DIE CARRIER MEMBER
(DIELECTRIC LAYER NOT SHOWN)

CROSS-SECTIONAL SIDE VIEW OF THE PACKAGED UV-LED DEVICE

METHOD OF MAKING PACKAGED UV-LED DEVICES

US 10,347,806 B2

PACKAGED UV-LED DEVICE WITH ANODIC BONDED SILICA LENS AND NO UV-DEGRADABLE ADHESIVE

TECHNICAL FIELD

The described embodiments relate to Ultraviolet Light Emitting Diode (UV-LED) assemblies.

BACKGROUND INFORMATION

High power UV-LEDs are increasingly popular and are finding new applications. For example, high output power UV-LED devices are now being used in UV-curing and UV-printing applications. FIG. 1 (Prior Art) is a top-down diagram of one commercially available UV-LED product 50. A packaged UV-LED 51 is mounted on a star board Metal Core Printed Circuit Board (MCPCB) substrate 52. FIG. 2 (Prior Art) is a diagram of the packaged UV-LED 51 of FIG. 1. The UV-LED die 53 is mounted on a ceramic substrate 54. A glass lens 55 that is inexpensive and tolerant of the high temperatures involved is employed. The overall assembly 50 of FIG. 1 is available as part number A00X-UV4 from LEDSupply, P.O. Box 326, 44 Hull Street, Randolph, Vt. 05060. The packaged UV-LED device 51 is a C3535U-UNx1 series LED available from SemiLEDs Corporation of 3F, No. 11, KeJung Road, Chu-Nan Site, Hsinchu Science Park, Chu-Nan 350, Miao-Li County, Taiwan, ROC. To increase directionality of the emitted UV radiation, a heat tolerant 20 mm polycarbonate lens made by Carclo Optics of Aylesbury, England, is sold along with the UV-LED device of FIG. 1. This secondary optic is mounted on top of the MCPCB substrate 52 such that legs of the secondary optic sit into corresponding holes on the MCPCB. UV-LED products such as these are adequately inexpensive and are believed to work well in their intended environments.

SUMMARY

Rather than using a desirably inexpensive glass lens or borosilicate glass lens, which absorbs UV radiation and is typically about half as expensive as a lens made of fused silica, a less common fused silica lens is employed in a novel packaged UV-LED device. Also, rather than using an inexpensive ceramic submount such as in the prior art device of FIG. 1 and FIG. 2, a novel die carrier member is employed. This novel die carrier member includes a unitary silicon cup member. A cup-shaped recess is formed into the upper surface of this unitary silicon cup member. In one example, the unitary silicon cup member is fashioned from homogenous monocrystalline silicon of a silicon wafer. The crystal lattice orientation of monocrystalline silicon atoms in the silicon of the unitary silicon cup member is employed during an anisotropic wet etching step to form the cup-shaped recess in an economical way. An aluminum reflector is then formed on the inside sidewalls of the cup-shaped recess. A thin layer of dielectric material is then formed over the aluminum in order to improve light extraction efficiency and to increase the overall total reflectivity of the reflector. In one example, this thin dielectric layer has a thickness of approximately one quarter wavelength of the wavelength of the UV radiation to be emitted from the UV-LED die. In another example, this thin dielectric layer has a thickness of approximately five quarters of the UV radiation wavelength. Regardless of the exact thickness of the thin dielectric layer, the dielectric has a thickness over the aluminum that is less than twice the UV radiation wavelength. The dielectric material has an index of refraction in a range of from about 1.4 to 2.5 and may, for example, be silicon nitride or silicon dioxide. The dielectric is preferably deposited using sputtering, but it may also be deposited by ebeam deposition or chemical vapor deposition.

There are no wirebonds on any top surface of the die carrier member, but rather metal through-silicon vias (TSVs) that extend vertically through the unitary silicon cup member are filled with metal. The resulting vertically-extending metal vias provide electrical contact between surface mount pads on the inside bottom of the cup-shaped recess and corresponding metal terminals on the bottom side of the overall die carrier member.

After the UV-LED die has been flip-chip surface mounted onto the pads on the bottom of the cup-shaped recess, the fused silica lens is bonded in a low temperature anodic bonding process down onto a silicon surface of the unitary silicon cup member of the die carrier member, thereby sealing the UV-LED die in an air-filled cavity. The thin dielectric has two purposes. First, it provides electrical and physical isolation for the aluminum reflector. Second, it increases the total reflectivity of the aluminum reflector. By virtue of the novel use of low temperature anodic bonding, there is no epoxy and no silicone and no other potentially UV-degradable adhesive material disposed between the lens and the unitary silicon cup member of the die carrier member. There are other expensive bonding techniques that might be usable for fixing the lens to the die carrier, but advantageously due to the use of anodic bonding the expensive materials involved in these other techniques need not be, and are not, provided. For example, gold/tin eutectic bonding materials are not employed in bonding the lens, and there is neither any gold or any tin or any other metals in contact with any part of the fused silica lens.

The anodic bonding is carried out at a temperature that is higher than 300 degrees Celsius so that the temperature is high enough to facilitate anodic bonding when a DC voltage of about 300-500 volts is present between the lens and die carrier member. The temperature employed during anodic bonding is, however, kept lower than 350 degrees Celsius. By keeping the temperature below 350 degrees Celsius, and by keeping the high temperature step to a duration of not more than ten minutes, the UV-LED die is not damaged in the anodic bonding step.

The resulting packaged UV-LED device is robust in that it employs no UV-degradable adhesives. For a device of this robustness, it is relatively inexpensive to manufacture. After the packaged UV-LED device has been manufactured, it is then typically mounted onto a star board MCPCB substrate. The packaged UV-LED device along with its star board MCPCB substrate are referred to together here as an UV-LED assembly.

Further details and embodiments and methods and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", "across", "horizontally", "laterally" and "bottom" are used herein to describe relative orientations in between different parts of the structure being described, and it is to be understood that the overall structure being described can actually be oriented in any way in three-dimensional space.

Figure 1:
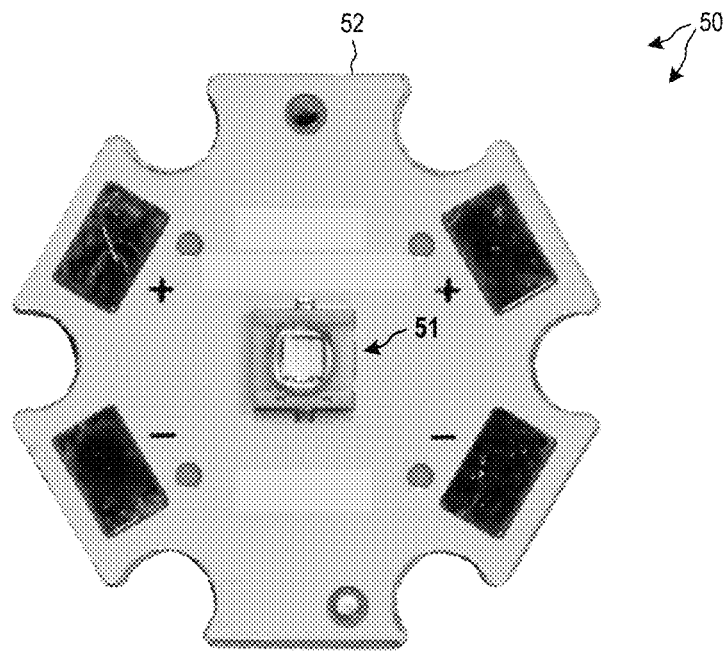
FIG. 1 (Prior Art) is a top-down photograph of a prior art UV-LED device.
Figure 2:
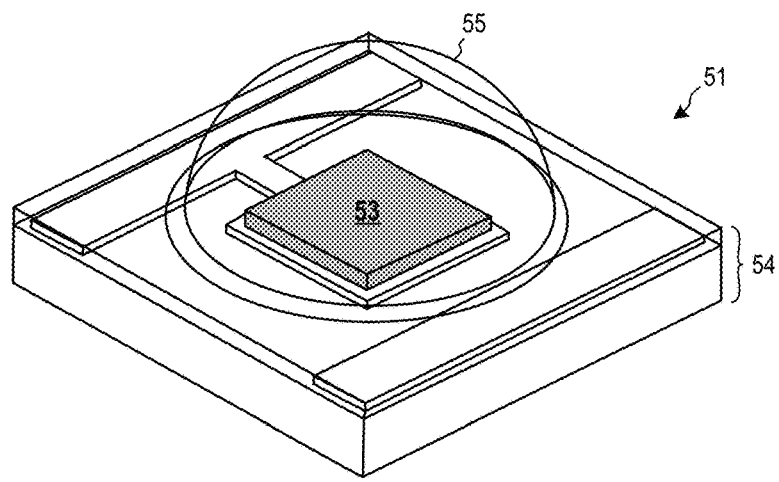
FIG. 2 (Prior Art) is a diagram of the packaged UV-LED in the device of FIG. 1.
Figure 3:
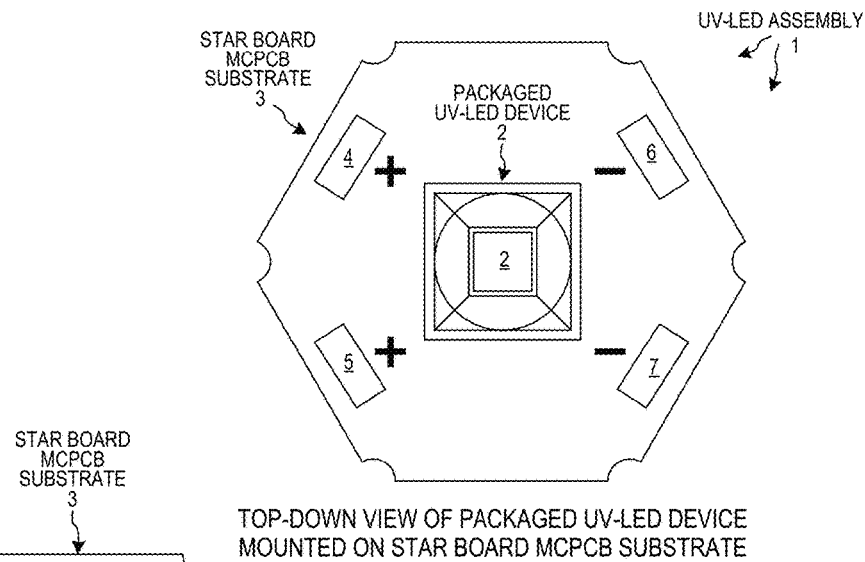
FIG. 3 is a top-down diagram of a UV-LED assembly 1 in accordance with one novel aspect.

FIG. 3 is a top-down diagram of an Ultraviolet Light Emitting Diode (UV-LED) assembly 1 in accordance with one novel aspect. UV-LED assembly 1 includes a packaged UV-LED device 2 and a "Star Board" Metal Core Printed Circuit Board (MCPCB) substrate 3. There are two "+" positive supply voltage metal terminals 4 and 5 and two "−" negative supply voltage metal terminals 6 and 7. A positive supply DC voltage with respect to the potential on the terminals 6 and 7 is driven onto one or both of the positive supply voltage terminals 4 and 5. A DC current flows onto the assembly 1 via one or both of the positive supply voltage metal terminals 4 and 5, through the packaged UV-LED device 2, and out of the assembly 1 via one or both of the negative supply voltage metal terminals 6 and 7. This current causes a UV-LED die within the UV-LED device 2 is emit ultraviolet radiation. In the present example, the UV-LED die emits radiation having a center wavelength in a range from 250 nanometers to 300 nanometers, and in particular in one embodiment the center wavelength of emissions is about 280 nanometers.

Figure 4:
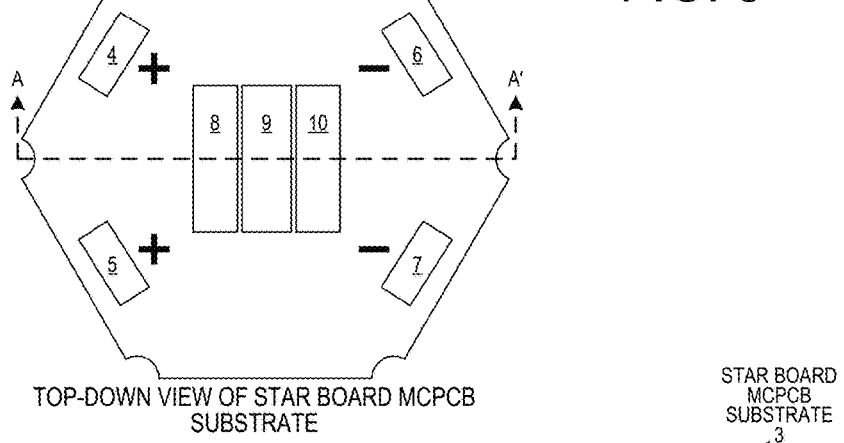
FIG. 4 is a top-down diagram of the star board MCPCB substrate 3 of the UV-LED assembly 1 of FIG. 3.

FIG. 4 is a top-down diagram of the star board MCPCB substrate 3 with the packaged UV-LED device 2 not shown so that the P positive supply voltage pad 8, the thermal pad 9, and the N negative supply voltage pad 10 are in view. The top surface of the star board MCPCB substrate 3 that is not one of the terminals 4-7 or one of the pads 8-10 is a top surface of a thin insulative solder mask material 11. The star board MCPCB substrate 3 is also called a "submount". The star board MCPCB substrate 3 may be made using MOCVD (Metal-Organic Chemical Vapor Deposition) techniques whereby a layer of metal can be deposited, followed by a layer of a dielectric, followed by another layer of metal. A metal layer is deposited by depositing thin layers of atoms in a chemical vapor deposition process. The star board MCPCB substrate 3 may also be made by photolithographically etching and laminating layers together in a process similar to that used to make FR4 printed circuit boards.

Figure 5:
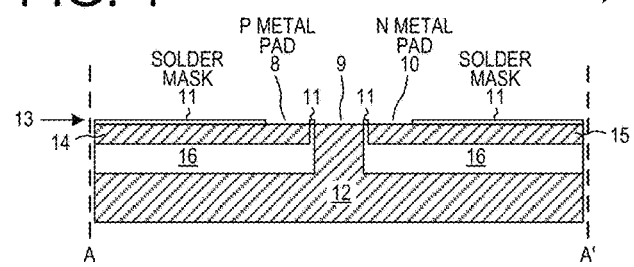
FIG. 5 is a cross-sectional side view of the star board MCPCB substrate 3 of the UV-LED assembly of FIG. 3.

FIG. 5 is a cross-sectional side view of the star board MCPCB substrate 3 taken along sectional line A-A' of FIG. 4. The entire bottom portion of the substrate 3 is a copper structure and layer 12. This copper structure 12 extends upward to the upper surface 13 of the substrate 3 in the area of the thermal pad 9. In addition to copper structure 12, the substrate 3 includes two other copper structures 14 and 15. Part of the upper surface of the copper structure 14 is left exposed by a hole in the solder mask 11. This part of the copper structure 14 is the P metal pad 8. Part of the upper surface of the copper structure 15 is left exposed by a hole in the solder mask 11. This part of the copper structure 15 is the N metal pad 10. The copper structures 14 and 15 are separated from the copper structure and layer 12 by an intervening layer 16 of dielectric material. The copper structures may be plated with thin layers of another metal such as gold.

Figure 6:
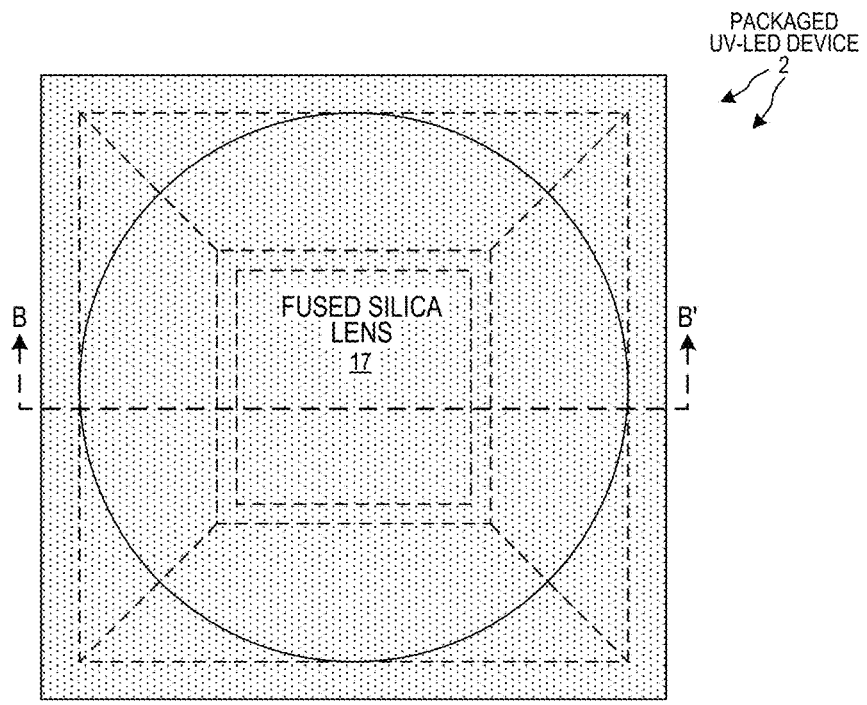
FIG. 6 is a top-down diagram of the packaged UV-LED device 2 of the assembly of FIG. 3

FIG. 6 is a top-down diagram of the packaged UV-LED device 2. The top of the packaged UV-LED device 2 is the top semispherical surface of a fused silica lens member 17. Fused silica is a noncrystalline (glass) form of silicon dioxide. The fused silica may be doped with sodium in order to promote future anodic bonding with silicon.

Figure 7:
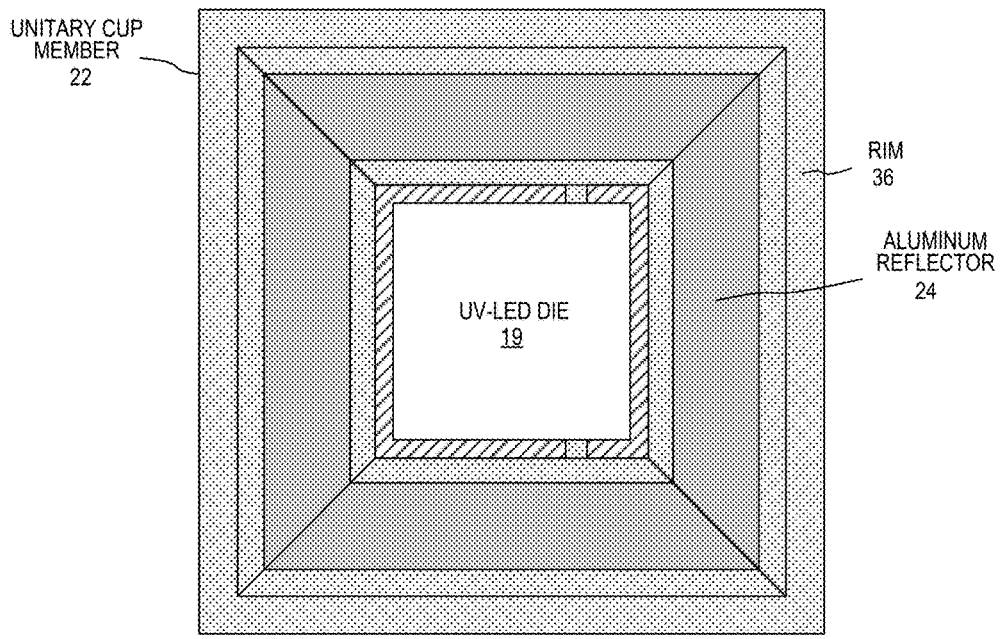
FIG. 7 is a top-down diagram of the packaged UV-LED device 2 with its fused silica lens member 17 removed so that the top of the underlying die carrier member 18 is in view.

FIG. 7 is a top-down diagram of the packaged UV-LED device 2 with its fused silica lens member 17 removed so that the top of the underlying die carrier member 18 is in view. The top of the die carrier member 18 forms a cup-shaped recess. The UV-LED die 19 is mounted in this recess in the center of the die carrier member 18.

Figure 8:
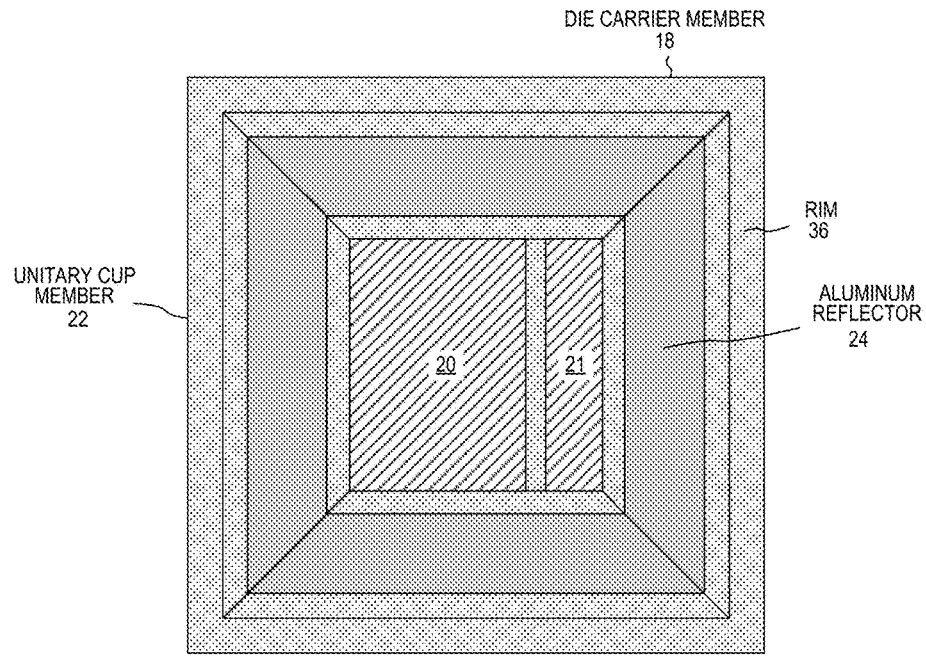
FIG. 8 is a top-down diagram of the die carrier member 18 of the packaged UV-LED device 2, with the UV-LED die removed.

FIG. 8 is a top-down diagram of the die carrier member 18 with the UV-LED die 19 removed so that the underlying first metal pad 20 and second metal pad 21 are in view.

Figure 9:
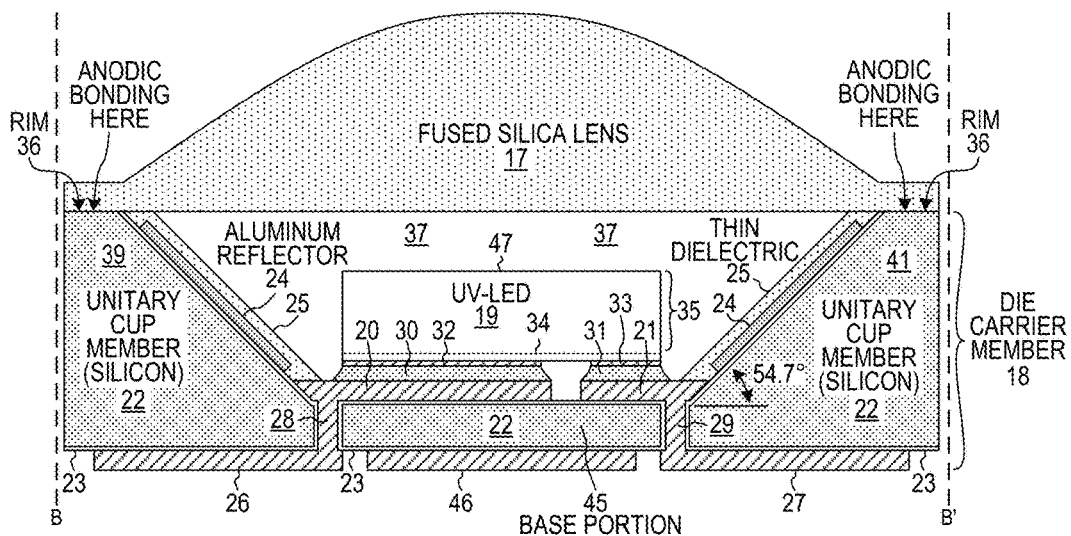
FIG. 9 is a cross-sectional side view of the packaged UV-LED device 2 of FIG. 6.

FIG. 9 is a cross-sectional side view taken along sectional line B-B' of FIG. 6. The die carrier member 18 includes a unitary cup member 22, a thin insulative silicon dioxide layer 23, an aluminum reflector 24, a dielectric layer 25, the first metal pad 20, the second metal pad 21, a first bottom side terminal 26, a second bottom side terminal 27, a third bottom side thermal terminal conduction 46, a first metal via 28 that couples the first bottom side terminal 26 to the first metal pad 20, and a second metal via 29 that couples the second bottom side terminal 27 to the second metal pad 21. The unitary cup member 22 has four flaring sidewall portions 39-42 and a central base portion 45. The unitary cup member 22 is "unitary" in the sense that all these "portions" are portions of a single piece of monocrystalline silicon. The first bottom metal terminal 26, the first metal via 28, and the first metal pad 20 are three different parts of the same metal structure. The first metal via 28 extends from the first metal pad 20, through the base portion 45 of the unitary cup member 18, and to the first bottom side terminal 26. Likewise, the second bottom metal terminal 27, the second metal via 29, and the second metal pad 21 are three different parts of the same metal structure. The second metal via 29 extends from the second metal pad 21, through the base portion 45 of the unitary cup member 18, and to the second bottom side terminal 27. The UV-LED die 19 is flip-chip surface mounted to the first and second metal pads 20 and 21 by amounts of solder 30 and 31. More specifically, a first terminal and pad 32 of the die 19 is soldered to by amount of solder 30 to the top of the first metal pad 20, and a second terminal and pad 33 of the die 19 is soldered by amount of solder 31 to the top of the second metal pad 21. Horizontal dashed line 34 represents the active semiconductor layers of the flip-chip mounted die 19. The upward-facing top surface 47 of the die is a surface of the sapphire substrate die portion 35 upon which the active layers were deposited. This sapphire is substantially transparent to the UV radiation emitted from the active layers. The unitary cup member 22 has a rim 36. This rim 36 extends peripherally around the cup recess. The fused silica lens member 17 is anodic bonded directly to the rim 36 so that the UV-LED die 19 is disposed inside a sealed cavity 37 formed by the die carrier member 18 and the fused silica lens member 17.

Figure 10:
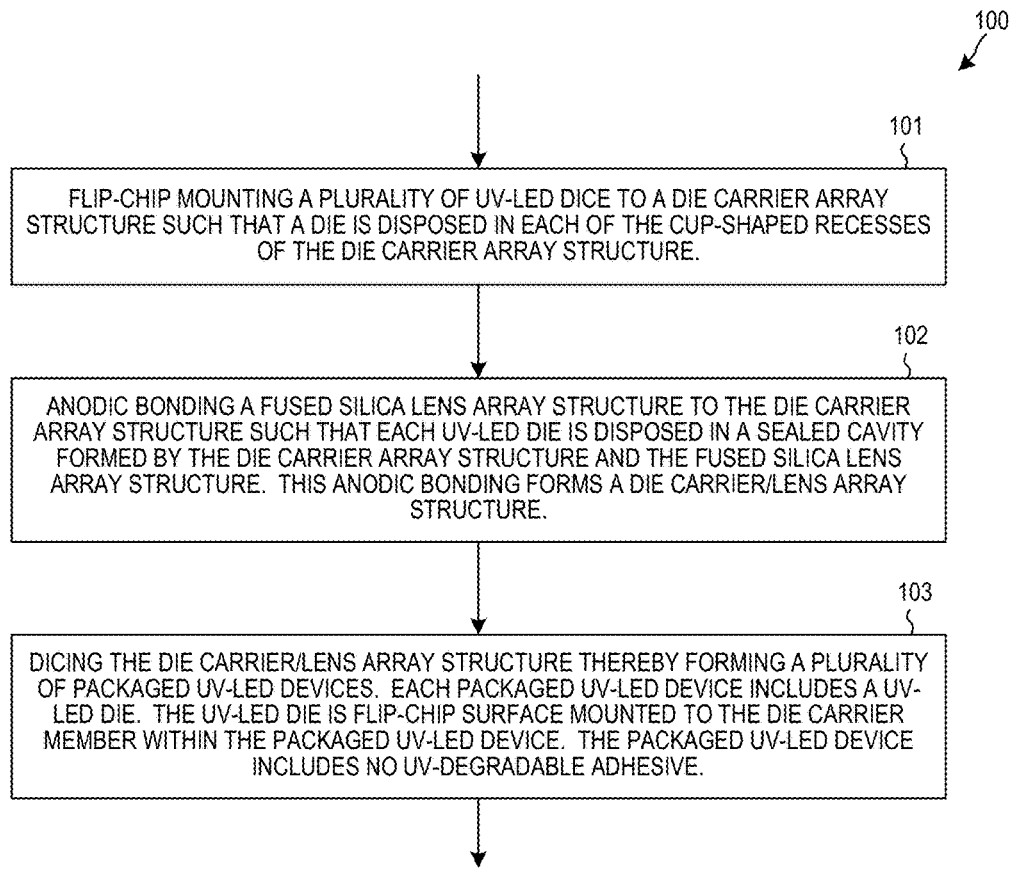
FIG. 10 is a flowchart of a method of manufacturing the packaged UV-LED device 2 of FIG. 6.

FIG. 10 is a flowchart of a method 100 of manufacturing the packaged UV-LED device 2. In a wet etching step, a two-dimensional array of cup-shaped recesses is formed into the top of a single monocrystalline silicon wafer. The 54.7 degree angle (the angle is illustrated in FIG. 9) of the four flaring inside sidewalls of the recess is due to the wet etching of a properly oriented monocrystalline silicon. The silicon atoms on each sidewall of the recess have the [1,1,1] orientation, whereas the silicon atoms on the surface of the bottom of the recess have the [0,0,1] orientation. The hole in the photomask through which this wet etching takes place is a square hole. Techniques and methods for etching recesses of the shape pictured in FIG. 7, having 54.7 degree sloped sidewalls, into silicon are known and employed in the MEMS industry (MicroElectroMechanical Systems industry). A heated potassium hydroxide (KOH) solution may be employed as an etchant in this wet etching step.

After the wet etching step, two downwardly-extending cylindrical via holes are formed (for example, by etching or laser drilling or ion beam milling) through the base portion 45 at the bottom of each of the cup-shaped recesses. The via holes can be formed from the wafer backside such as in another etching step different from the etching of the topside etching of the wafer. Regardless of whether these via holes are formed from the wafer topside or wafer backside or a combination of the two, each via hole extends all the way through the silicon wafer. Next, a thin layer of silicon dioxide is formed over the entire silicon surface of the wafer structure so as to form silicon dioxide layer 23. This thin silicon dioxide layer 23 may be a thermal oxide so that the inside surfaces of the via holes are covered with silicon dioxide.

The metal structures 26,28,20 and 27,29,21 and 46 of FIG. 9 are then formed. Copper may, for example, be plated over the entire bottom surface and over the entire top surface, and then may be selectively removed to leave the metal structures illustrated in FIG. 9. Copper is employed for its thermal conduction properties for these metal structures.

Next, an aluminum reflector is formed in each cup-shaped recess. Aluminum reflector 24 is one of these reflectors. Sputtering, ebeam deposition, or chemical vapor deposition may be employed to deposit the aluminum. Once deposited, the aluminum can be patterned and etched, or a lift off process can be employed. In one example, the aluminum reflectors are 50 nanometers thick. As long as the aluminum thickness is greater than about 40 nanometers thick, it can fully reflect UV radiation. Accordingly, the metal structures 26, 28, 20, 27, 29, 21 and 46 are made from a metal that is different from the metal from which the reflector 24 is made.

After the formation of the aluminum reflectors, a thin dielectric layer is formed directly on and over the aluminum reflector in each cup-shaped recess. The thin dielectric is formed so that it does not cover the metal at the bottoms of the recesses. In one example, the thin dielectric is silicon nitride that is approximately one quarter wavelength thick where the dielectric is disposed on aluminum. The wavelength is the wavelength of the UV radiation emitted by the UV-LED die, which is about 280 nanometers. In particular, the silicon nitride layer over the top of the aluminum is about 50 nanometers thick. After deposition of this thin silicon nitride layer, the top of the wafer can be resurfaced and cleaned, such as by chemical mechanical polishing, so that the rim 36 is a clean and planar silicon surface.

At this point, the wafer has the structure of many instances of the die carrier member 18 of FIG. 9 adjoining each other in the wafer structure. This overall wafer structure 104 is called a "die carrier array structure". UV-LED dice are then flip-chip mounted (step 101) to this die carrier array structure 104 such that there is one UV-LED die disposed in each of the cup recesses of the die carrier array structure 104. The bottom surface of a wafer-shaped fused silica lens array structure 105 is cleaned and resurfaced so that its bottom surface is clean and is as planar as possible. The wafer-shaped fused silica lens array structure 105 is then anodic bonded (step 102) to the carrier array structure 104 such that each UV-LED die is disposed in a separate sealed cavity formed by the die carrier array structure (from below) and the fused silica lens array structure (from above).

Figure 11:
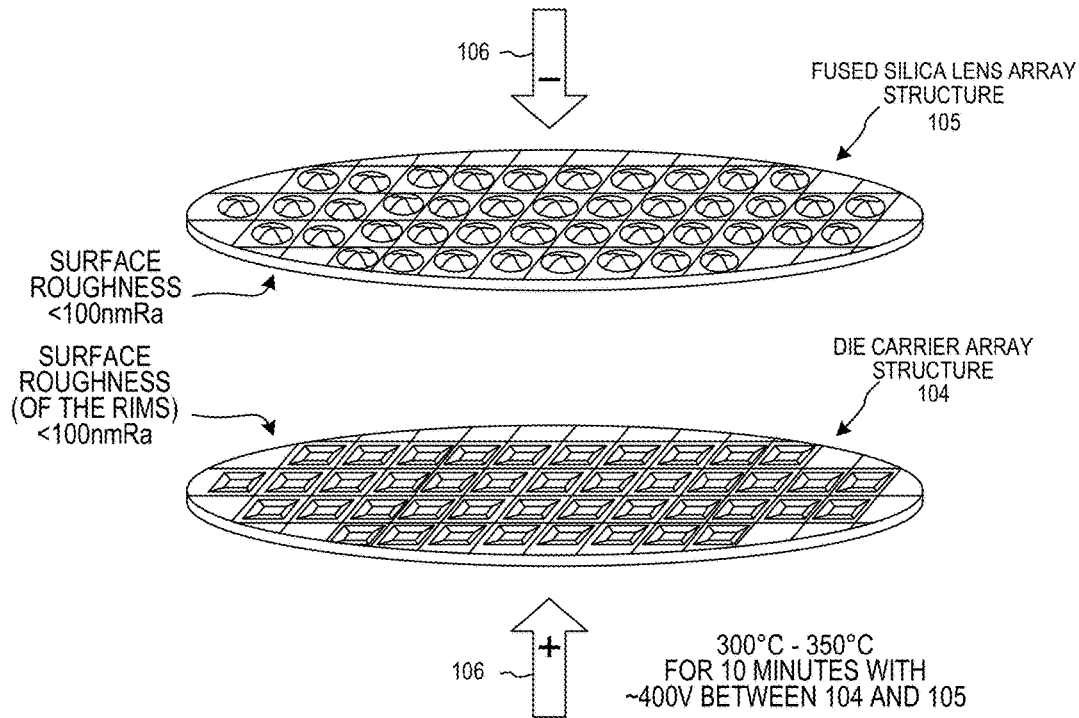
FIG. 11 is an illustration showing how a fused silica lens array structure 105 is brought down and into contact with a die carrier array structure 104 in a low temperature anodic bonding step in the manufacture of the packaged UV-LED device 2 of FIG. 6.

FIG. 11 is an illustration showing how the fused silica lens array structure 105 is brought down and into contact with the carrier array structure 104 in this low temperature anodic bonding step. Arrows 106 represent the pressing of the two structures 104 and 105 together. More specifically, the structure 104 is disposed on a chuck (not shown) and a top tool (not shown) is pressed downward on the structure 105 from the top, thereby forcing the two structures 104 and 105 together. The top tool has a downward-facing surface that is conformal to the shape of the upward facing surface of the fused silica lens array structure 105. Each of the two joining surfaces (the bottom surface of structure 105 and the upward facing planar rim surface of structure 14) has a surface roughness that is less than 100 nmRa (Ra<100 nm). The structures 104 and 105 are heated to a temperature of at least 300 degrees Celsius and less than 350 degrees Celsius, and are held at this temperature for a time of ten minutes while a DC voltage of about 400 volts is disposed between the two structures. The high temperature assists the dissociation of alkali oxides present in the structure 105, thereby creating alkali ions and oxygen ions. The silicon of the die carrier array structure has a positive 400 volt potential with respect to the fused silica lens array structure. As a result of these temperature, pressure and voltage conditions, there is a migration of oxygen ions to the boundary between the two structures 104 and 105. This causes an irreversible bond to form between the two structures 104 and 105 without the use of any epoxy or silicone or other adhesive. There is no epoxy or silicone or other potentially UV-degradable adhesive disposed anywhere between the rims of the die carrier members of the die carrier array structure 104 and the fused silica lens array structure 105. The result of this anodic bonding is a die carrier/lens array structure 107.

Figure 12:
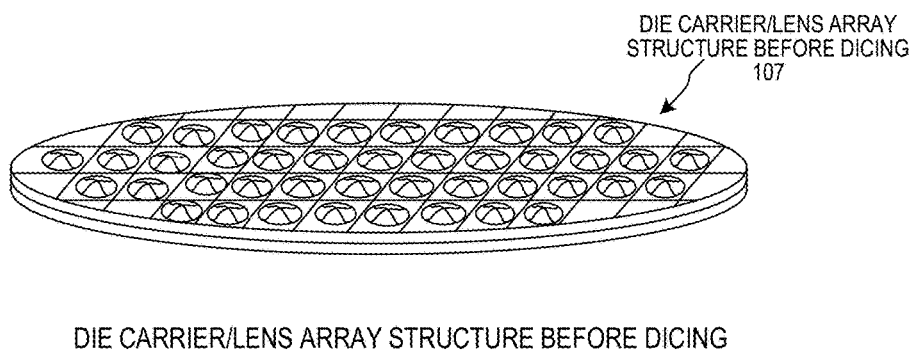
FIG. 12 is a diagram of the die carrier/lens array structure 107 that results from the anodic bonding step illustrated in FIG. 11.

FIG. 12 is a diagram of the die carrier/lens array structure 107. The die carrier/lens array structure 107 is then diced (step 103), thereby forming a plurality of packaged UV-LED devices. Each packaged UV-LED device has the structure illustrated in FIG. 9. Each packaged UV-LED device has a UV-LED die that is flip-chip mounted to the die carrier member within the packaged UV-LED device.

Although the die carrier member 18 of FIG. 9 in the example described above involves a unitary cup member 22 and is fashioned from a homogenous monocrystalline silicon wafer, in another example it is not fashioned from a silicon wafer. Rather, the die carrier member involves a ceramic (for example, AlN) substrate over which a molded EMC (Epoxy Molding Compound) structure is disposed, where the molded EMC structure is molded to form the cup-shaped recesses. The bottom surface of each of the cup-shaped recesses in this case is a top surface of the ceramic substrate. The dielectric/aluminum reflector is formed on the flaring EMC sidewalls, and metal is deposited and patterned to form the pads, vias, and bottom side terminals. In yet another example, the die carrier member involves an FR4 substrate board portion. In yet another example, the die carrier member is fashioned from a unitary piece of glass. The glass has been formed and/or is etched and/or is machined to have the desired shape with the cup-shaped recesses. Although not illustrated in the example of FIG. 9 described above, one or more of the metal structures may include surface plating layer and/or may include a barrier metal layer.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   (a) flip-chip surface mounting an Ultraviolet Light Emitting Diode (UV-LED) die to a die carrier array structure such that the UV-LED die is disposed in a cup recess of the die carrier array structure, wherein the cup recess is one of a plurality of cup recesses each of which extends into the a surface of the die carrier array structure; and
   (b) anodic bonding a fused silica lens array structure to the die carrier array structure such that the UV-LED die is disposed in a sealed cavity formed by the die carrier array structure and a fused silica lens of the fused silica lens array structure, wherein the fused silica lens is one of a plurality of fused silica lenses of the fused silica lens array structure, wherein the anodic bonding forms a die carrier/lens array structure, and
   (c) dicing the die carrier/lens array structure thereby forming a plurality of packaged UV-LED devices, wherein the UV-LED die that is flip-chip surface mounted in (a) is a part of one of the packaged UV-LED devices formed in (c),
   wherein the die carrier array structure comprises an aluminum reflector disposed with the cup recess directly on a first dielectric layer and a second dielectric layer disposed directly on and over the aluminum reflector, wherein the second dielectric layer forms a surface of the die carrier array structure, wherein the second dielectric covers sidewall surfaces of the aluminum reflector.

2. The method of claim 1, wherein said one of the packaged UV-LED devices formed in (c) comprises:
   a first bottom side terminal a part of which forms an outside surface of the packaged UV-LED device, wherein the first bottom side terminal is electrically coupled by a first metal via to a first terminal of the UV-LED die; and
   a second bottom side terminal a part of which forms an outside surface of the packaged UV-LED device, wherein the second bottom side terminal is electrically coupled by a second metal via to a second terminal of the UV-LED die.

3. The method of claim 1, wherein the die carrier array structure comprises:
   a silicon wafer, wherein a plurality of cup recesses extend into a top surface of the silicon wafer;
   a plurality of aluminum reflectors, wherein each respective one of the aluminum reflectors is disposed on a cup sidewall surface of a corresponding one of the plurality of cup recesses of the silicon wafer;
   a plurality of first metal pads, wherein each respective one of the first metal pads is disposed on a cup bottom surface of a corresponding one of the plurality of cup recesses of the silicon wafer;
   a plurality of second metal pads, wherein each respective one of the second metal pads is disposed on a cup bottom surface of a corresponding one of the plurality of cup recesses of the silicon wafer;
   a first plurality of metal vias, wherein each respective one of the first plurality of metal vias extends from the first metal pad in a corresponding one of the plurality of cup recesses of the silicon wafer, through the silicon wafer, and to a bottom surface of the silicon wafer; and
   a second plurality of metal vias, wherein each respective one of the second plurality of metal vias extends from the second metal pad in a corresponding one of the plurality of cup recesses of the silicon wafer, through the silicon wafer, and to the bottom surface of the silicon wafer.

4. The method of claim 1, wherein the anodic bonding of (b) involves heating the die carrier array structure to a temperature of at least 300 degrees Celsius and wherein the anodic bonding of (b) involves keeping the temperature of the die carrier member below 350 degrees Celsius.

5. A method comprising:
   (a) flip-chip surface mounting an Ultraviolet Light Emitting Diode (UV-LED) die to a die carrier member such that the UV-LED die is disposed in a cup recess of the die carrier member, wherein a rim of the die carrier member extends around the cup recess, wherein the die carrier member has a cup bottom surface and also has a cup sidewall surface, and wherein the UV-LED die is mounted to the cup bottom surface; and
   (b) after the mounting of (a) anodic bonding a surface of a lens to the rim of the die carrier member such that the UV-LED die is disposed in a cavity formed by the die carrier member and the lens,
   wherein the die carrier array structure comprises an aluminum reflector disposed with the cup recess directly on a first dielectric layer and a second dielectric layer disposed directly on and over the aluminum reflector, wherein the second dielectric layer forms a surface of the die carrier array structure, wherein the second dielectric covers sidewall surfaces of the aluminum reflector.

6. The method of claim 5, wherein the die carrier member at the time of the flip-chip surface mounting of (a) is a part of a die carrier array structure, and wherein the lens at the time of the anodic bonding of (b) is a part of a lens array structure.

7. The method of claim 6, wherein the anodic bonding of (b) involves heating the die carrier member to a temperature of at least 300 degrees Celsius, and wherein the anodic bonding of (b) involves keeping the temperature of the die carrier member below 350 degrees Celsius.

8. A method of claim 6, wherein the cup sidewall surface meets the cup bottom surface at an angle of approximately 54.7 degrees.

9. The method of claim 5, wherein the die carrier member comprises a unitary cup member formed of a single homogenous material, wherein the single homogenous material of the unitary cup member forms a base portion of the unitary cup member and also forms a sidewall portion of the unitary cup member.

10. The method of claim 9, wherein the single homogenous material is a monocrystalline material.

11. The method of claim 5, wherein the die carrier member at the time of the flip-chip mounting of (a) comprises no epoxy adhesive, no silicone, and no glass-reinforced epoxy laminate, and wherein at the time of the anodic bonding of (b) there is no epoxy adhesive and no silicone disposed in contact with the lens.

12. The method of claim 5, wherein the lens is a fused silica lens.

* * * * *